(12) United States Patent
Tseng et al.

(10) Patent No.: US 7,041,590 B2
(45) Date of Patent: May 9, 2006

(54) FORMATION METHOD FOR CONDUCTIVE BUMP

(75) Inventors: Tsung-Yen Tseng, Ping-Tung (TW); Zhi-Hao Chen, Taipei (TW); Chi-Long Tsai, Kaohsiung (TW)

(73) Assignee: Advanced Semiconductor Engineering Inc., Nantze Export Processing Zone Kaohsiung (TW)

( * ) Notice: Subject to any disclaimer, the term of this patent is extended or adjusted under 35 U.S.C. 154(b) by 119 days.

(21) Appl. No.: 10/891,007

(22) Filed: Jul. 15, 2004

(65) Prior Publication Data

US 2005/0272242 A1    Dec. 8, 2005

(30) Foreign Application Priority Data

Jul. 18, 2003   (TW) ............................... 92119641 A

(51) Int. Cl.
*H01L 21/44* (2006.01)
(52) U.S. Cl. ....................... 438/613; 438/612
(58) Field of Classification Search ................ 438/613, 438/612, 614; 247/772, 779, 780, 781
See application file for complete search history.

(56) References Cited

U.S. PATENT DOCUMENTS

| | | | |
|---|---|---|---|
| 5,616,517 A * | 4/1997 | Wen et al. ................... 438/125 |
| 5,773,897 A * | 6/1998 | Wen et al. ................... 257/778 |
| 6,486,054 B1 * | 11/2002 | Fan et al. .................... 438/613 |
| 6,602,775 B1 * | 8/2003 | Chen et al. .................. 428/612 |
| 6,649,507 B1 * | 11/2003 | Chen et al. .................. 438/614 |
| 6,930,031 B1 * | 8/2005 | Huang ......................... 438/612 |

* cited by examiner

*Primary Examiner*—Mary Wilczewski
*Assistant Examiner*—Seth Barnes
(74) *Attorney, Agent, or Firm*—Birch, Stewart, Kolasch & Birch, LLP

(57) ABSTRACT

A method for forming conductive bumps is applied to a wafer. An under-bump-metallurgy structure and a first photo resist layer are subsequently formed on the wafer. The first photo resist layer, such as a dry film, is patterned to have some openings and then a second photo resist layer is filled into the openings, in which the thickness of the second photo resist layer is fewer than or equal to the thickness of the first photo resist layer. The second photo resist layer is then patterned to have some openings. Next, a conductive layer is formed in the openings and then both the first and second photo resist layers are removed. With the conductive layer as a mask, the exposed under-bump-metallurgy structure is removed and then the conductive layer is reflowed to form some conductive bumps. With two kinds of photo resist layers, the conductive bumps can be provided with increased heights and decreased pitches.

20 Claims, 7 Drawing Sheets

FORMATION METHOD FOR CONDUCTIVE BUMP

This Non-provisional application claims priority under 35 U.S.C. § 119(a) on Patent Application No(s). 092119641 filed in Taiwan on Jul. 18, 2003, the entire contents of which are hereby incorporated by reference.

BACKGROUND OF THE INVENTION

1. Field of the Invention

This invention relates to a formation method for conductive bumps, and more particularly to a method for forming solder bumps or gold studs with two kinds of photo resist layers.

2. Description of the Prior Art

With the development of IC technology, the package of the IC is strictly required for the function of a product subjects to the technology of the package. The typical package, such as dual in-line package, QFP package, plastic flat package, and so on. The phenomenon of cross talk happens when the frequency of an IC is over 100 MHz. Furthermore, those traditional package technologies are not suitable for an IC with more than 208 pins. Now, most of the chips with the high pins are implemented by the technology of ball grid array package (BGA). Thus, the technology of ball grid array package becomes one of the best chooses for the packages of CPU, south/north bridge chips, and so on.

On the other hand, the technology of BGA includes multitudes of types, such as plastic BGA substrate, ceramic BGA substrate, flip chip BGA substrate, tape BGA substrate, and cavity down PBGA substrate. A typical package of IC includes single IC through the processes of leadframe or substrate, die attach, wiring, molding, trimming and forming, and so on. The packaged IC has a multiple size larger than the chip. Among them, for flip chip BGA, there are gold studs or solder bumps on an IC for soldering of PWB.

For example, FIGS. 1A through 1C are schematically cross-viewed diagrams illustrating the formation of solder bumps in accordance with a prior art. Shown on FIG. 1A, An under bump metallurgy layer 112(UBM layer) is on a wafer 110, which consists of an adhesive/diffusion barrier and a wetting layer for improved adhesion between solder balls and the surface. Next, shown in FIG. 1B, a photo resist layer 114 is formed on the under bump metallurgy layer 112. FIG. 1C shows that a pattern is transferred onto the photo resist layer 114 and then the photo resist layer 114 is patterned by lithography and etching.

However, used as the photo resist layer 114, a dry film is with a poor resolution as its thickness is on the increase. Thus, the thicker dry film is less capable of forming the solder bumps with the smaller pitches. Alternatively, a liquid photo resist layer used as photo resist layer 114 has a height subject to its fluidity. Thus, the thinner liquid photo resist layer is unsuitable to form the solder bumps with the thicker height. Furthermore, if a pattern with a high density is transferred onto the liquid photo resist layer, smaller openings would result in bridging.

SUMMARY OF THE INVENTION

The method of the present invention addresses many of the shortcomings of the prior art. It is one object of the present invention to provide a formation method of conductive bump. The dry film is utilized to define the pattern of a conductive bump with the thicker height.

It is another object of the present invention to provide a formation method of conductive bump with a fine pitch. A liquid photo resist layer is formed in a patterned dry film to define the pattern of a conductive bump with the finer pitch.

It is further object of the present invention to provide a formation method of conductive bump with both larger height and finer pitch. The association of the dry film implements a pattern of a conductive bump with a desired pitch and liquid photo resist layer.

In accordance with an exemplary embodiment of the present invention, a method for forming conductive bumps is provided. An under-bump-metallurgy structure is formed on a wafer. A first photo resist layer is formed on the under-bump-metallurgy structure. The portion of the first photo resist layer is removed to form first openings that expose the partial under-bump-metallurgy structure. A second photo resist layer is formed in the first openings and then removed a portion to form second openings in the first openings that expose the partial under-bump-metallurgy structure and the diameter of any second opening is smaller than the diameter of any the first opening. A conductive layer is formed on the exposed under-bump-metallurgy structure. Then the first and second photo resist layers removed. The under-bump-metallurgy structure is removed with the conductive layer as a mask. Then the conductive layer is reflowed to form conductive bumps.

BRIEF DESCRIPTION OF DRAWINGS

The foregoing and other objects, features, and advantages of the invention will become more readily apparent upon reference to the following detailed description of a presently preferred embodiment, when taken in conjunction with the accompanying drawings in which like numbers refer to like parts, and in which.

DETAILED DESCRIPTION OF THE INVENTION

Figure 1A:
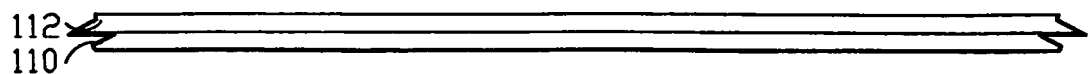
FIGS. 1A through 1C are schematically cross-viewed diagrams illustrating the formation of solder bumps in accordance with a prior art.
Figure 1B:
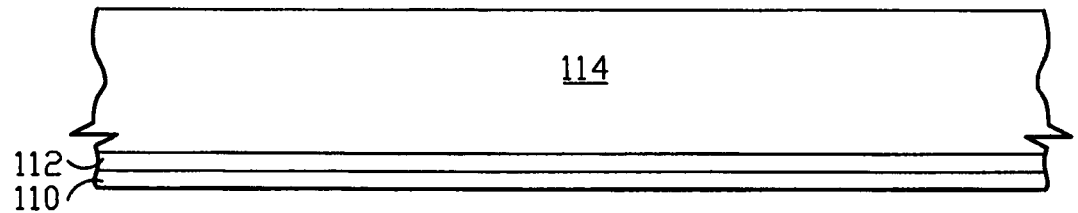
Figure 1C:
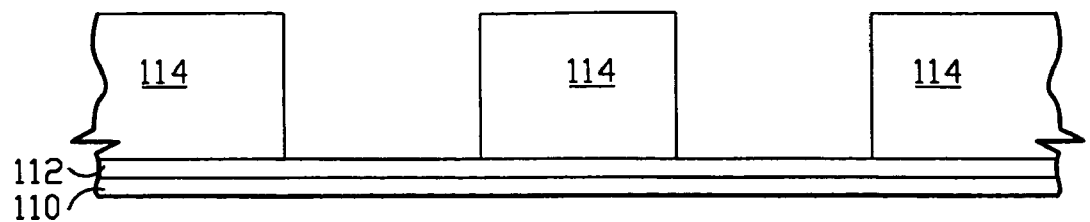

An appropriate and preferred embodiment will now be described in the formation of conductive bumps. It should be noted, however, that this embodiment is merely an example and can be variously modified without departing from the scope of the present invention.

FIGS. 2A through 2F are schematic cross-sectional diagrams illustrating the method of forming conductive bumps in accordance with the present invention. Shown in FIG. 2A, a conductive structure 12 is formed on a wafer 10, followed by the formation of a photo resist 14 with multitudes of first openings 24. In one embodiment, the wafer 10 may be a silicon wafer. The conductive structure 12, such as an under-bump-metallurgy (UBM) structure, is implemented by subsequently sputtering an aluminum layer, a nickel-vanadium layer, and a copper layer. In the embodiment, the aluminum layer, nickel-vanadium layer, and the copper layer constitute the (UBM) structure. The photo resist layer 14, such as a dry film, first covers the whole surface of the conductive structure 12, and then some first openings 24 are formed by the pattern lithography and etching on the photo resist layer 14. The first openings 24 expose the partial surface of the conductive structure 12.

Figure 2A:
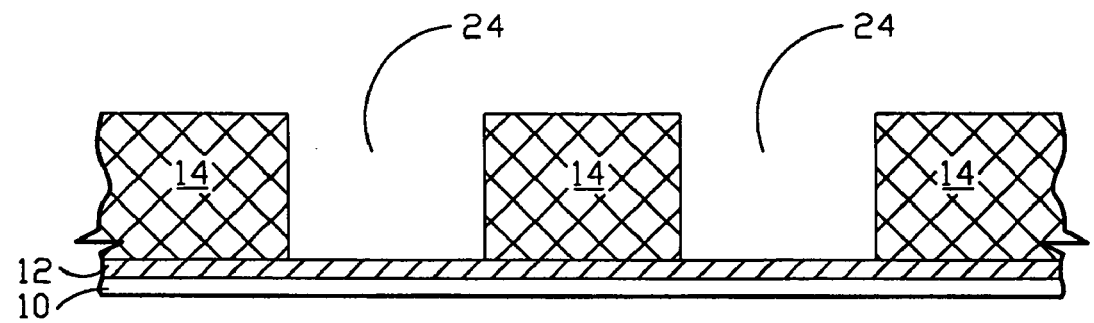
FIGS. 2A through 2F are schematic cross-sectional diagrams illustrating the method of forming conductive bumps in accordance with the present invention.
Figure 2B:
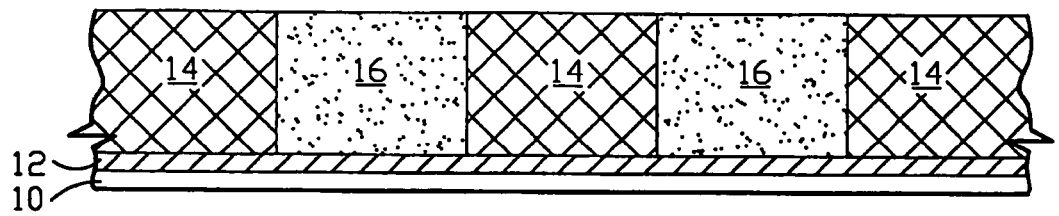
Figure 2C:
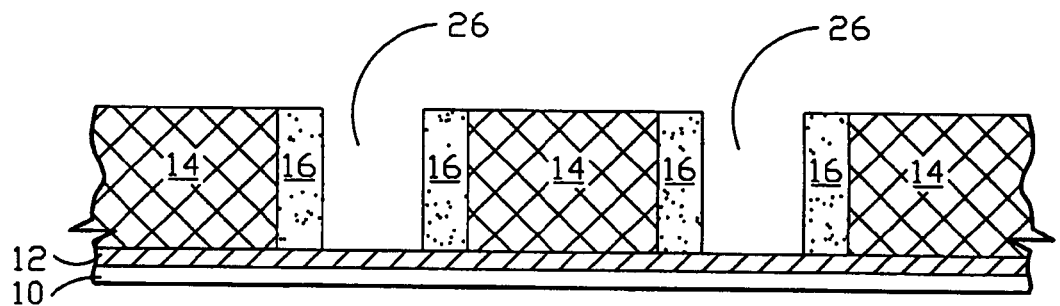

Next, depicted in FIG. 2B, another photo resist layer 16 is formed in the first openings 24 by any suitable methods. In one embodiment, the photo resist layer 16, a liquid photo resist layer, fills up the first openings 24 by coating and exposes the surface of the conductive structure 12 exposed by the first openings 24. In the present invention, with the help of the photo resist layer 14(dry film), the photo resist layer 16 in the first openings would have the similar thickness to the photo resist layer 14 has. In the embodiment, the thickness of the photo resist layer 16 is from about 5 micrometers to about 150 micrometers. Next, similar to the photo resist layer 14, some second openings 26 are formed in the photo resist layer 16 by patterning lithography and etching method on the photo resist layer 16. The second openings 26 also expose the partial surface of the conductive structure 12, shown on FIG. 2C.

In the embodiment, each second opening 26 is also in one of first opening 24. One of the features of the invention, any second opening 26 shaped by the photo resist layer 16 has a smaller diameter than any first opening 24 shaped by the photo resist layer 14, so as to subsequently form the smaller devices. Furthermore, the photo resist layer 16, which can have a similar thickness to the photo resist layer 14, would be of help to subsequent formation of the higher devices, albeit a liquid photo resist layer would be for use. Furthermore, the photo resist layer 16, a liquid photo resist layer, can compensate the photo resist layer 14 for the loss due to the under-cut configuration of the first opening 24, thus the issue of under cut is reduced.

Figure 2D:
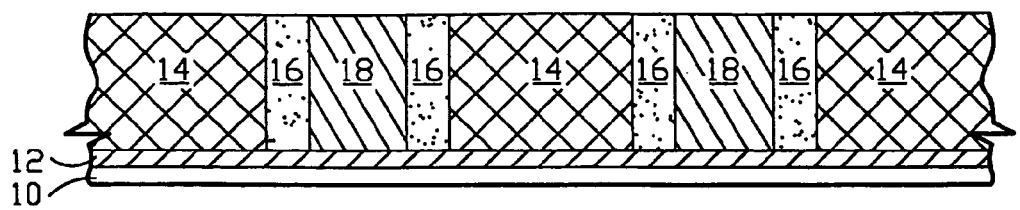
Figure 2E:
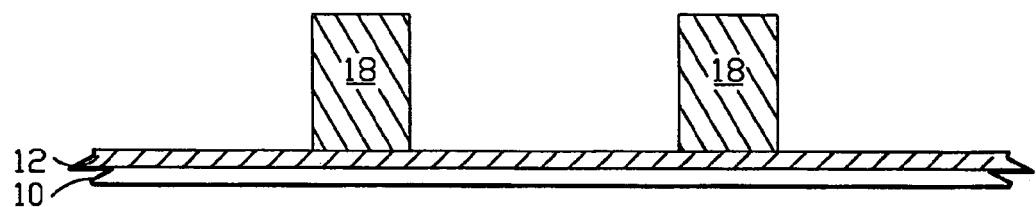
Figure 2F:
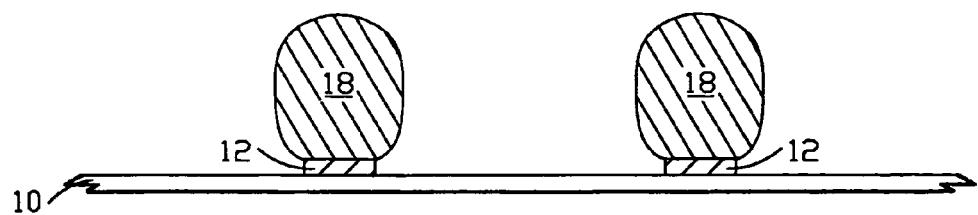

Next, shown on FIG. 2D, a conductive layer 18 is filled into the second openings 26 by any suitable methods. In the embodiment, With the printing or plating of solder bump or gold stud, the conductive layer 18 covers the surfaces of the conductive structures 12 exposed by the second openings 26. Accordingly, the solder bump or gold stud in the present invention would have the smaller pitches or the higher thickness. Next, depicted in FIG. 2E, the photo resist layers 14 and 16 are removed by any suitable methods, such as a stripping method. FIG. 2F shows that the exposed conductive structure 12 is removed with the conductive layer 18 as a mask, then multitudes of solder balls or gold studs as conductive bumps are implemented by reflowing the conductive layer 18.

Figure 3A:
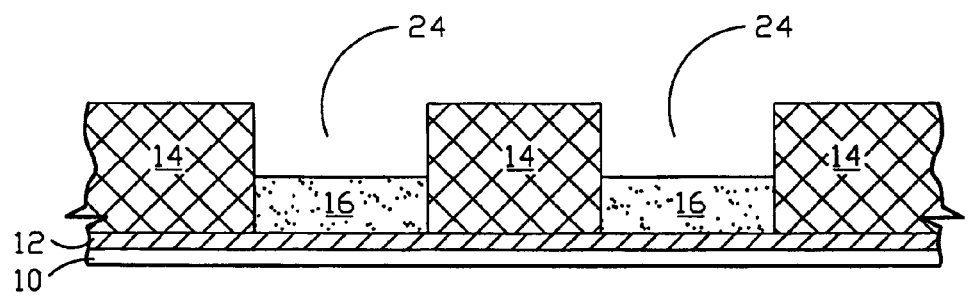
FIGS. 3A through 3E are schematically cross-viewed diagrams illustrating another embodiment in accordance with the present invention.
Figure 3B:
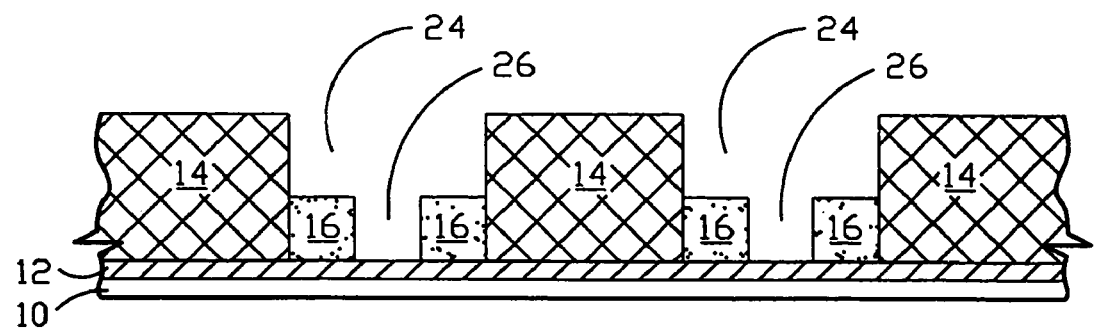
Figure 3C:
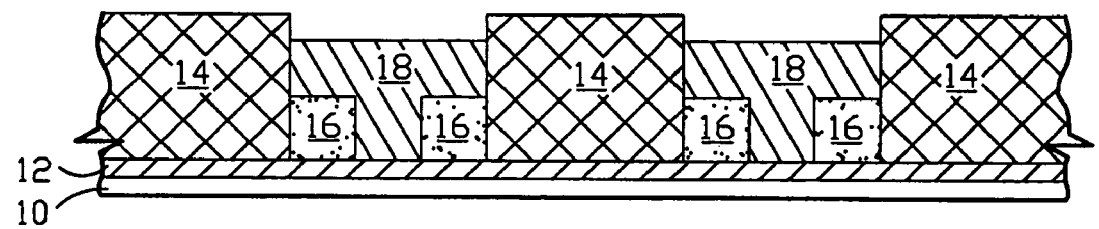
Figure 3D:
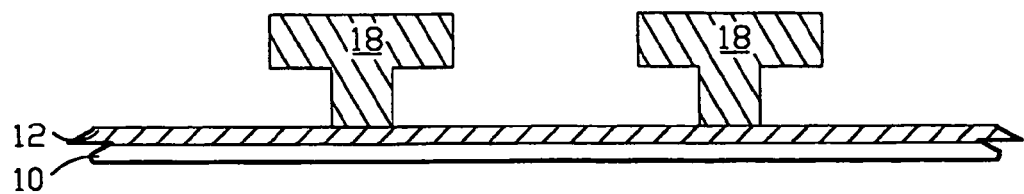
Figure 3E:
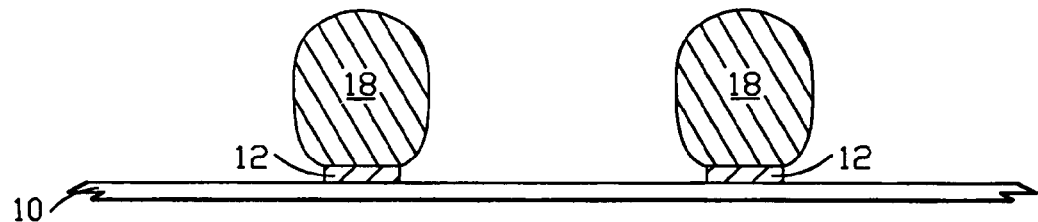

FIGS. 3A through 3E are schematically cross-viewed diagrams illustrating another embodiment in accordance with the present invention. Shown on FIG. 3A, similar to FIGS. 2A through 2B, the photo resist layer 16 is formed in the first openings 24. FIG. 3B shows that some second openings 26 are formed in the photo resist layer 16. Each second openings 26, which exposes the partial surface of the conductive structure 12, has a smaller diameter than any one of the first opening 24. Next, shown in FIG. 3C, the conductive layer 18 fills up the second openings 26 and further covers atop the photo resist layer. That is, the conductive layer 18 fills into the first openings 24. In the embodiment, the conductive layer 18 would either fill up or fill partially the rest first openings 24 to improve the height of conductive devices with a "T" shape. FIG. 3D, similar to FIG. 2E, the photo resist layers 14 and 16 are removed. Next, FIG. 3E, similar to FIG. 2F, the exposed conductive structure 12 is removed and the solder balls or gold studs are implemented by reflowing.

The present invention provides a method for forming conductive bumps. An under-bump-metallurgy structure is formed on a wafer. A first photo resist layer is formed on the under-bump-metallurgy structure. The portion of the first photo resist layer is removed to form first openings that expose the partial under-bump-metallurgy structure. A second photo resist layer is formed in the first openings and then removed a portion to form second openings in the first openings that expose the partial under-bump-metallurgy structure and the diameter of any second opening is smaller than the diameter of any the first opening. A conductive layer is formed on the exposed under-bump-metallurgy structure. Then the first and second photo resist layers removed. The under-bump-metallurgy structure is removed with the conductive layer as a mask. Then the conductive layer is reflowed to form conductive bumps.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for forming a plurality of conductive bumps, comprising:
   providing a wafer;
   forming an under-bump-metallurgy structure on said wafer;
   forming a first photo resist layer on said under-bump-metallurgy structure;
   removing a portion of said first photo resist layer to form a plurality of first openings, wherein said first openings expose a portion of said under-bump-metallurgy structure;
   forming a second photo resist layer in said first openings to cover said portions of said under-bump-metallurgy structure;
   removing a portion of said second photo resist layer to form a plurality of second openings so as to have said portions of said under-bump-metallurgy structure partially exposed through said second openings to form exposed portions of said under-bump-metallurgy structure, wherein the diameter of each said second opening is smaller than the diameter of each said first opening;
   forming a conductive layer on said exposed portion of said under-bump-metallurgy structure;
   removing said first photo resist layer;
   removing said second photo resist layer;
   removing said under-bump-metallurgy structure with said conductive layer as a mask formed thereon; and
   reflowing said conductive layer to form said plurality of conductive bumps.

2. The method in accordance with claim 1, wherein the step of forming said first photo resist layer comprises covering a dry film atop said under-bump-metallurgy structure.

3. The method in accordance with claim 2, wherein the step of forming said second photo resist layer comprising coating a liquid photo resist layer in said first openings.

4. The method in accordance with claim 1, wherein said second photo resist layer fills up said first openings.

5. The method in accordance with claim 1, wherein the thickness of said second photo resist layer is less than the thickness of said first photo resist layer.

6. The method in accordance with claim 5, wherein the step of forming said conductive layer further comprises covering atop said second photo resist layer.

7. The method in accordance with claim 5, wherein the step of forming said conductive layer further comprises filling up said first openings.

8. The method in accordance with claim 1, wherein the thickness of said second photo resist layer ranges from about 5 micrometers to about 150 micrometers.

9. The method in accordance with claim 1, wherein the thickness of said second photo resist layer is substantially equal to the thickness of said first photo resist layer.

10. The method in accordance with claim 1, wherein the step of forming said conductive layer comprises forming a solder layer in said second openings.

11. The method in accordance with claim 1, wherein the step of forming said conductive layer comprises plating a plurality of gold studs in said second openings.

12. A method for forming a plurality of conductive bumps, applied on a wafer, said method comprising:

forming an under-bump-metallurgy structure on the wafer;

forming a first photo resist layer on said under-bump-metallurgy structure;

removing a portion of said first photo resist layer to form a plurality of first openings on a portion of said under-bump-metallurgy structure;

forming a second photo resist layer in said plurality of first openings;

removing a portion of said second photo resist layer to form a plurality of second openings on said portion of said under-bump-metallurgy structure;

forming a conductive layer in said plurality of second openings;

removing said first photo resist layer;

removing said second photo resist layer;

removing said under-bump-metallurgy structure with said conductive layer as a mask; and reflowing said conductive layer to form said plurality of conductive bumps.

13. The method in accordance with claim 12, wherein the step of forming said first photo resist layer comprises covering a dry film atop said under-bump-metallurgy structure.

14. The method in accordance with claim 13, wherein the step of forming said second photo resist layer comprising coating a liquid photo resist layer in said plurality of first openings.

15. The method in accordance with claim 12, wherein said second photo resist layer fills up said plurality of first openings.

16. The method in accordance with claim 12, wherein the thickness of said second photo resist layer is less than the thickness of said first photo resist layer.

17. The method in accordance with claim 16, wherein the step of forming said conductive layer further comprises covering atop said second photo resist layer.

18. The method in accordance with claim 12, wherein the step of forming said conductive layer comprises printing a solder layer in said plurality of second openings.

19. The method in accordance with claim 12, wherein the step of forming said conductive layer comprises plating a plurality of gold studs in said plurality of second openings.

20. The method in accordance with claim 12, wherein the step of forming said under-bump-metallurgy structure comprises:

sputtering an aluminum layer on the wafer;

sputtering a nickel-vanadium layer on said aluminum layer; and sputtering a copper layer on said nickel-vanadium layer.

* * * * *